United States Patent
Shen

(10) Patent No.: US 10,665,269 B1
(45) Date of Patent: May 26, 2020

(54) HARD DRIVE MODULE AND HARD DRIVE REMOVABLE ENCLOSURE THEREOF

(71) Applicant: Super Micro Computer Inc., San Jose, CA (US)

(72) Inventor: William Shen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/255,638

(22) Filed: Jan. 23, 2019

(51) Int. Cl.
*H05K 5/00* (2006.01)
*G11B 33/02* (2006.01)

(52) U.S. Cl.
CPC .............. *G11B 33/022* (2013.01); *H05K 5/00* (2013.01)

(58) Field of Classification Search
None
See application file for complete search history.

(56) References Cited

U.S. PATENT DOCUMENTS

| | | | |
|---|---|---|---|
| 9,412,418 B2* | 8/2016 | Hu | G06F 1/18 |
| 9,733,679 B1* | 8/2017 | Chen | G11B 33/124 |
| 2007/0015407 A1* | 1/2007 | Loftus | H01R 13/4538 439/607.01 |
| 2010/0233912 A1* | 9/2010 | Chiang | H01R 13/60 439/638 |
| 2012/0038177 A1* | 2/2012 | Greiner | E05B 47/0012 292/157 |
| 2015/0382494 A1* | 12/2015 | Hu | G06F 1/18 248/314 |
| 2017/0099877 A1* | 4/2017 | Worm | A61M 11/042 |

* cited by examiner

*Primary Examiner* — Courtney L Smith
*Assistant Examiner* — Rashen E Morrison
(74) *Attorney, Agent, or Firm* — Chun-Ming Shih; HDLS IPR Services

(57) ABSTRACT

A hard drive module includes a hard drive and a hard drive removable enclosure. The hard drive includes a bottom surface having a first securement hole formed to indent inward thereon and a lateral surface having a second securement hole formed to indent inward thereon. The second securement hole is fluidly connected to the first securement hole. The bottom surface of the hard drive is received on a carrier plate. A primary positioning pin penetrates into the first securement hole from the bottom surface of the hard drive. A hook penetrates into the second securement hole from the internal of the first securement hole. Accordingly, by using the primary positioning pin with its rear end formed of the hook thereon for securing the hard drive, the hard drive can be installed and secured inside the hard drive removable enclosure without the use of any tools.

8 Claims, 7 Drawing Sheets

# HARD DRIVE MODULE AND HARD DRIVE REMOVABLE ENCLOSURE THEREOF

BACKGROUND OF THE INVENTION

Field of the Invention

The technical field relates to a hard drive module of a server, in particular, to a hard drive module and a hard drive removable enclosure for the installation of a hard drive therein without the use of any tools.

Description of Related Art

Hard drive removable enclosures are commonly used in server equipment, and each enclosure is typically installed with one hard drive therein. The hard drive removable enclosure can be used for inserting into a predefined space in server equipment in order to swap hard drives. Currently available hard drive removable enclosures are typically a box with six flat surfaces with the top surface opened for receiving a hard drive therein. After a hard drive is placed into the hard disk removable enclosure, screws are then fastened from the bottom surface or the lateral surface of other side of the hard drive removable enclosure into the hard drive removable enclosure, such that the screws are fastened onto the hard drive in order to secure the hard drive inside the hard drive removable enclosure.

Accordingly, the steps for installing a hard drive into a currently available hard drive enclosure are complicated, which not only requires the use of tools for fastening the hard drive, making it inconvenient for removal/installation of the hard drive, but also tends to cause tiny components of screws to be lost during the removal/installation of the hard drive.

In view of above, the inventor seeks to overcome the aforementioned drawbacks associated with the currently existing technology after years of research and development along with the utilization of academic theories, which is also the objective of the development of the present invention.

SUMMARY OF THE INVENTION

The present invention provides a hard drive module and a hard drive removable enclosure thereof for the installation of a hard drive therein without the use of any tools.

The present invention provides a hard drive removable enclosure, comprising a carrier plate having one side arranged with a vertical blocking board and a top surface arranged with a primary positioning pin protruded therefrom; and a top end of the primary positioning pin having one side arranged with a hook extended outward therefrom in a lateral direction.

According to an exemplary embodiment of the hard drive removable enclosure of the present invention, the blocking board includes an elastic arm extended therefrom, and the elastic arm is configured to bend from the blocking board toward the primary positioning pin.

According to an exemplary embodiment of the hard drive removable enclosure of the present invention, the elastic arm includes one side having a lock button protruded therefrom, and the lock button protrudes toward the primary positioning pin.

According to an exemplary embodiment of the hard drive removable enclosure of the present invention, the top surface of the carrier plate includes a secondary positioning pin protruded therefrom.

According to an exemplary embodiment of the hard drive removable enclosure of the present invention, the carrier plate includes a positioning board stacked thereon, and a portion of the positioning board is arranged spaced apart from the carrier plate in order to form a sliding slot between the positioning board and the carrier plate. In an exemplary embodiment, the positioning board is extended to form the blocking board. In another exemplary embodiment, the positioning board is extended to form the primary positioning pin.

According to an exemplary embodiment of the hard drive removable enclosure of the present invention, the hook is configured to extend away from the blocking board.

The present invention further provides a hard drive module, comprising a hard drive and an aforementioned hard drive removable enclosure. The hard drive includes a bottom surface with a first securement hole formed to intend inward thereon and a lateral surface with a second securement hole formed to intend inward thereon. The second securement hole is fluidly connected to the first securement hole. The bottom surface of the hard drive is received on the carrier plate. The primary positioning pin penetrates into the first securement hole from the bottom surface of the hard drive, and the hook penetrates into the second securement hole from the first positioning hole. In addition, the blocking board abuts against another lateral surface of the hard drive opposite thereto.

According to an exemplary embodiment of the hard drive module of the present invention, the blocking board includes an elastic arm extended therefrom, and the elastic arm is configured to bend from the blocking board toward the primary positioning pin. The elastic arm includes one side having a lock button protruded therefrom, and the lock button protrudes toward the primary positioning pin in order to be further locked into another second securement hole on the another lateral surface of the hard drive.

According to an exemplary embodiment of the hard drive module of the present invention, the top surface of the carrier plate includes a secondary positioning pin protruded therefrom, and the secondary positioning pin is locked into another first securement hole on the bottom surface of the hard drive.

According to an exemplary embodiment of the hard drive removable enclosure of the present invention, the carrier plate includes a positioning board stacked thereon, and a portion of the positioning board is arranged spaced apart from the carrier plate in order to form a sliding slot between the positioning board and the carrier plate. In an exemplary embodiment, the positioning board is extended to form the blocking board. In another exemplary embodiment, the positioning board is extended to form the primary positioning pin.

According to an exemplary embodiment of the hard drive removable enclosure of the present invention, the hook is configured to extend away from the blocking board.

The hard drive module and the hard drive removable enclosure thereof of the present invention utilize a primary positioning pin with its rear end formed of hook thereon end arranged inside the hard drive removable enclosure in order to secure the hard drive therein. One side of the hard drive is obliquely inserted into the hard drive removable enclosure in order to allow the primary positioning pin to be able to penetrate into the first securement hole, followed by placing the hard drive flatly into the hard drive removable enclosure such that its hook is able to be locked into the second securement hole. Consequently, the hard drive can be installed and secured into the hard drive removable enclosure without the user of any tools.

DETAILED DESCRIPTION OF THE INVENTION

Figure 1:
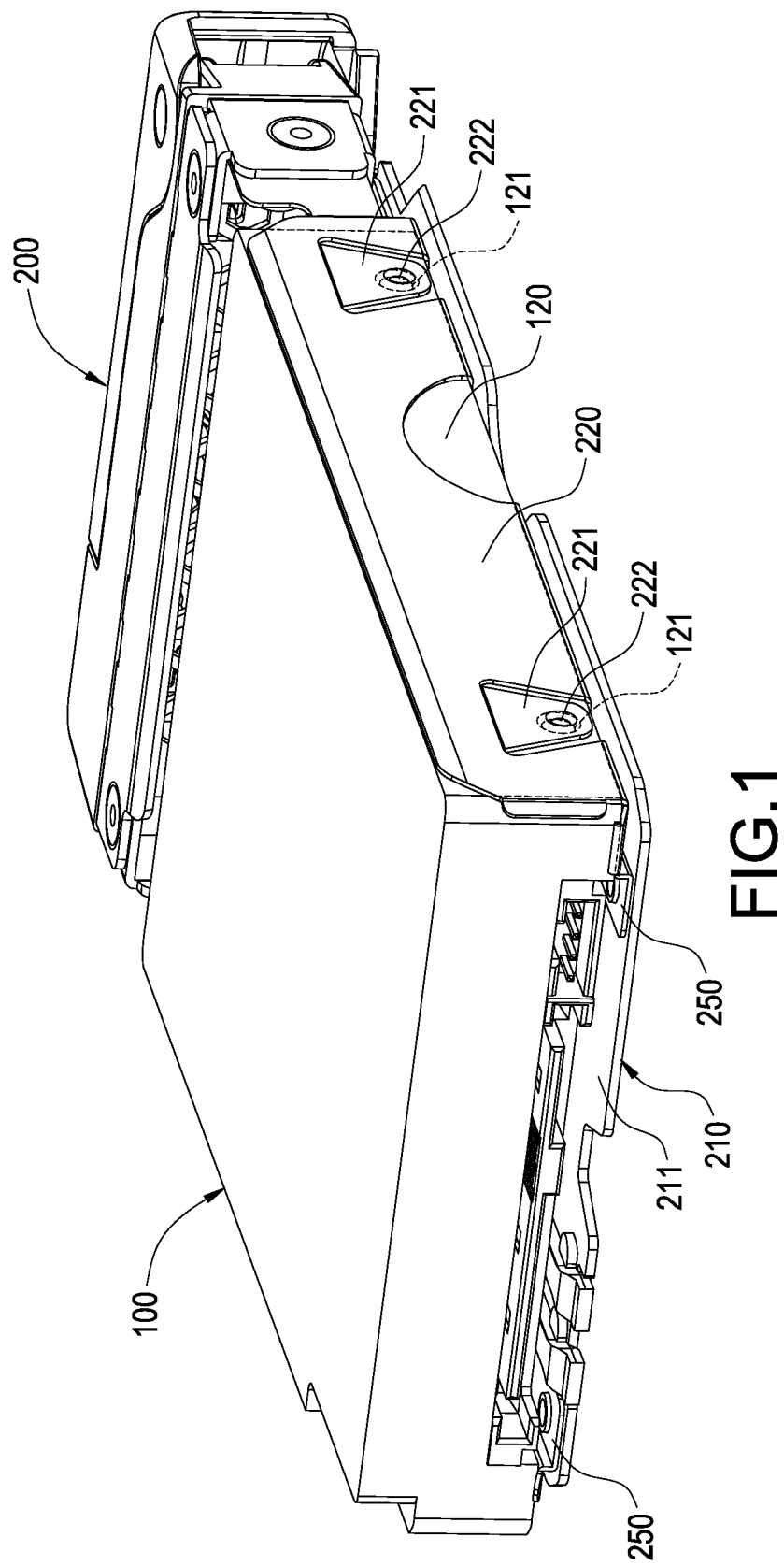
FIG. 1 is a perspective view of a hard drive module according to an exemplary embodiment of the present invention.

As shown in FIG. 1, a hard drive module according to an exemplary embodiment of the present invention is provided, comprising a hard drive 100 and a hard drive removable enclosure 200.

Figure 4:
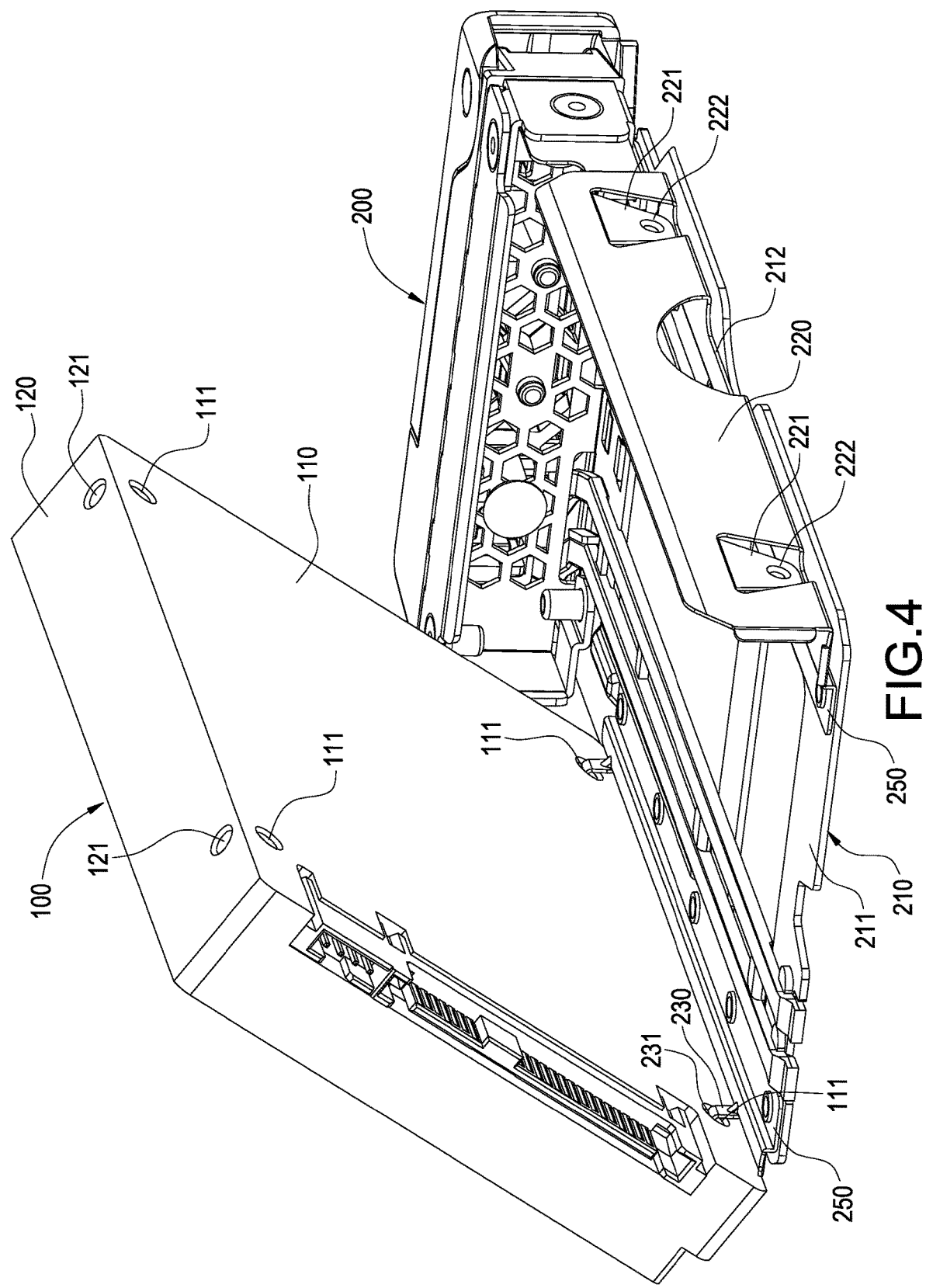
FIG. 4 to FIG. 6 are schematic views showing the assembly of the hard drive module according to an exemplary embodiment of the present invention.

As shown in FIG. 4, in an exemplary embodiment, the hard drive 100 is preferable to be a 2.5" hard drive 100. The bottom surface 110 of the hard drive 100 includes at least one first securement hole 111 formed to indent inward thereon. In an exemplary embodiment, the bottom surface 110 of the hard drive 100 is preferably formed of a plurality of first securement holes 111, and these first securement holes 111 are arranged on two opposite sides of the bottom surface 110 of the hard drive 100 respectively.

On the hard drive 100, its two opposite lateral surfaces 120 corresponding to the two opposite sides of the aforementioned bottom surface 110 include a plurality of second securement holes 121 formed to indent inward thereon corresponding to each of the first securement holes 111. In addition, each second securement hole is fluidly connected to the first securement hole 111 respectively.

Figure 2:
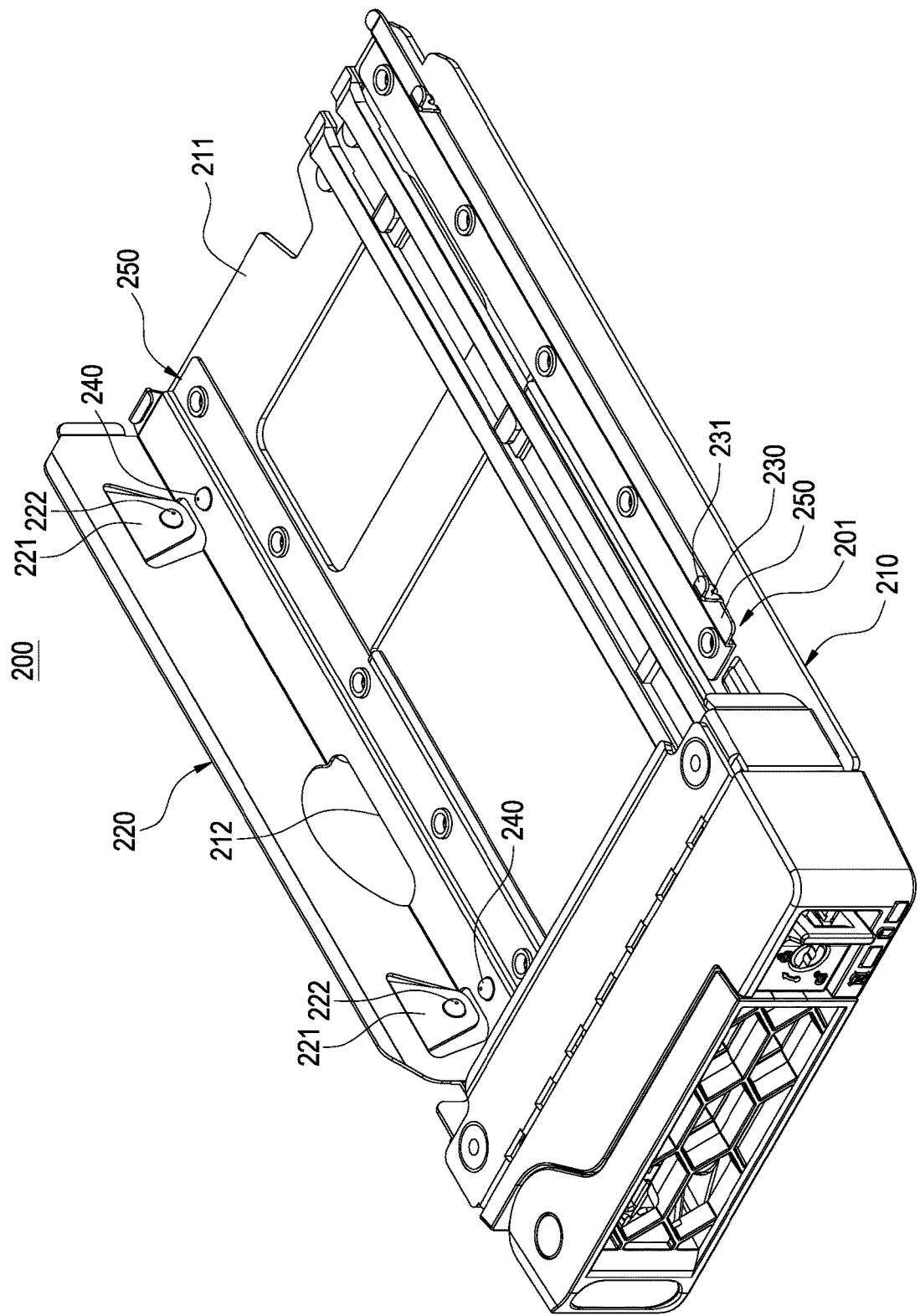
FIG. 2 and FIG. 3 are perspective views showing a hard drive removable enclosure of the hard drive module according to an exemplary embodiment of the present invention.
Figure 3:
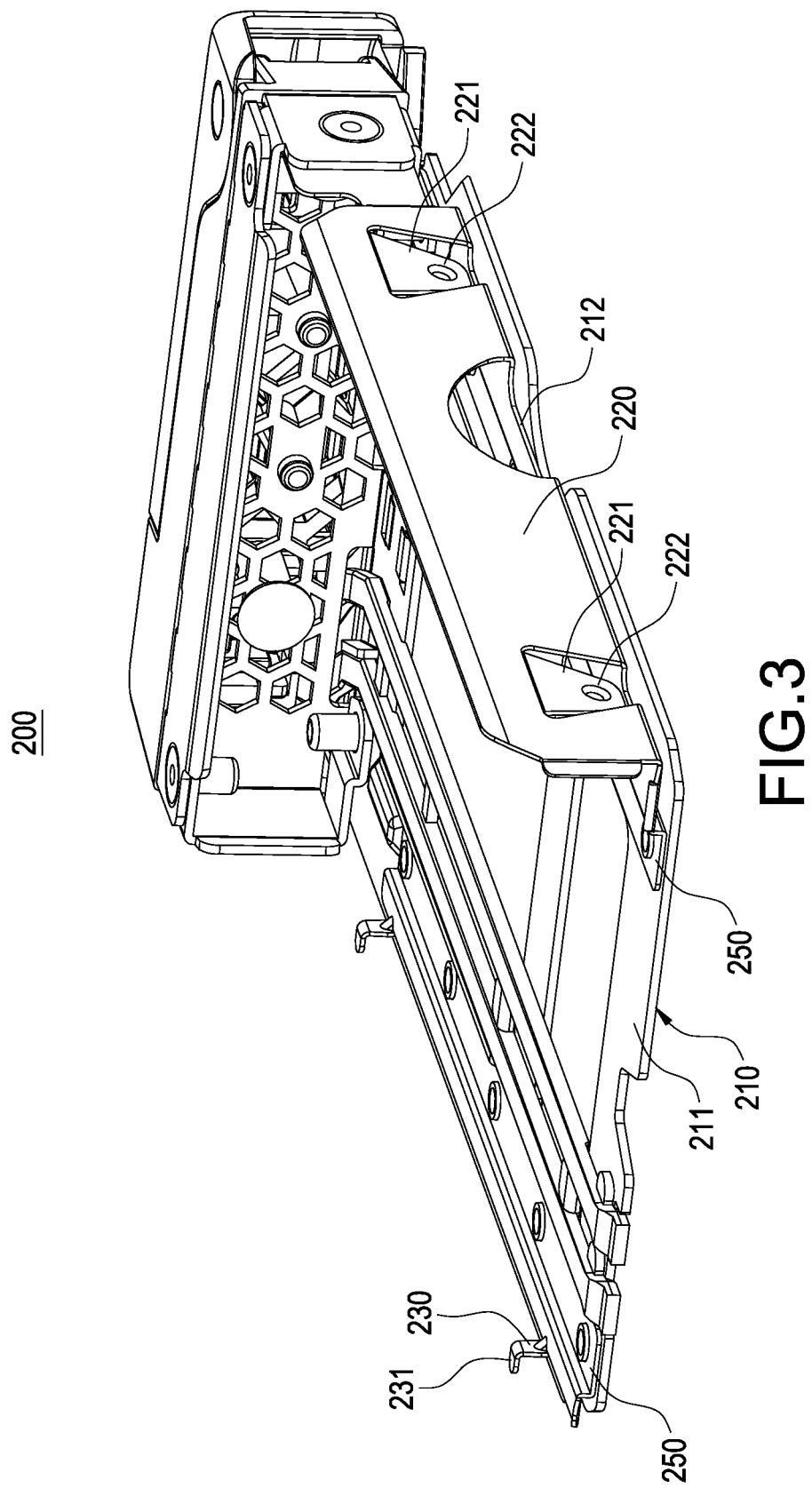

Please refer to FIG. 2 and FIG. 3. In an exemplary embodiment, the hard drive removable enclosure 200 comprises a carrier plate 210. One side of the carrier plate includes a vertical block board 220 arranged thereon, and a top surface 211 of the carrier plate 210 includes a primary positioning pin 230 protruded therefrom. The top end of the primary positioning pin 230 includes a hook 231 bent toward one side of the primary positioning pin 230 and extended outward therefrom in a lateral direction. In addition, the hook 231 extends in a direction away from the blocking board 220. The blocking board 220 preferably includes an elastic arm 221 extended therefrom, and the elastic arm 221 is bend from the blocking board 220 toward the primary positioning pin 230. The elastic arm 221 includes a lock button 222 formed thereon and protruded toward one side of the primary positioning pin 230. The top surface of the carrier plate 210 includes a secondary positioning pin 240 protruded therefrom.

To be more specific, the carrier plate 210 includes at least one positioning board 250 stacked thereon. In an exemplary embodiment, the carrier plate 210 is preferably stacked with a pair of positioning boards 250 opposite from each other and arranged on two sides of the top surface 211 of the carrier plate 210. The positioning boards 250 can also be arranged on another side of the carrier plate 210 such that the present invention is not limited to such configuration only.

Each positioning board 250 is preferably bent into a ladder shape respectively in order to allow a portion of each positioning board 250 to be spaced apart from the carrier plate 210 such that a sliding slot 201 can be formed between the positioning board 250 and the carrier plate 210. In an exemplary embodiment, a pair of sliding slots 210 formed on the pair of positioning boards are preferably configured to be opposite from each other toward the outer side thereof.

In an exemplary embodiment, preferably, an edge of one of the positioning board 250 is further extended and bent to form the aforementioned primary positioning pin 230. The other positioning board 250 can then impacted to form the aforementioned secondary positioning pin 240, and its edge is further extended and bent to form the aforementioned blocking board 220. However, it can be understood that the present invention is not limited to such configuration only; for example, the primary positioning pin 230 and the blocking board 220 can also be formed by respectively bending a portion of the edge of the carrier plate 210.

Please refer to FIG. 1 to FIG. 6. The bottom surface 110 of the hard drive 100 is received on the top surface 211 of the carrier plate 210. The primary positioning pin 230 penetrates into the first securement hole 111 from the bottom surface 110 of the hard drive 100, and the hook further penetrates into the second securement hole 121 from the internal of the first securement hole 111.

The primary positioning pin 230 secures the hard drive 100 along a direction parallel to the carrier plate 210, such that the hard drive 100 is limited from horizontal movement relative to the carrier plate 210. The hook 231 secures the hard drive 100 along a direction perpendicular to the carrier plate 210 in order to prevent the hard drive 100 from disengaging away from the carrier plate 210.

Figure 5:
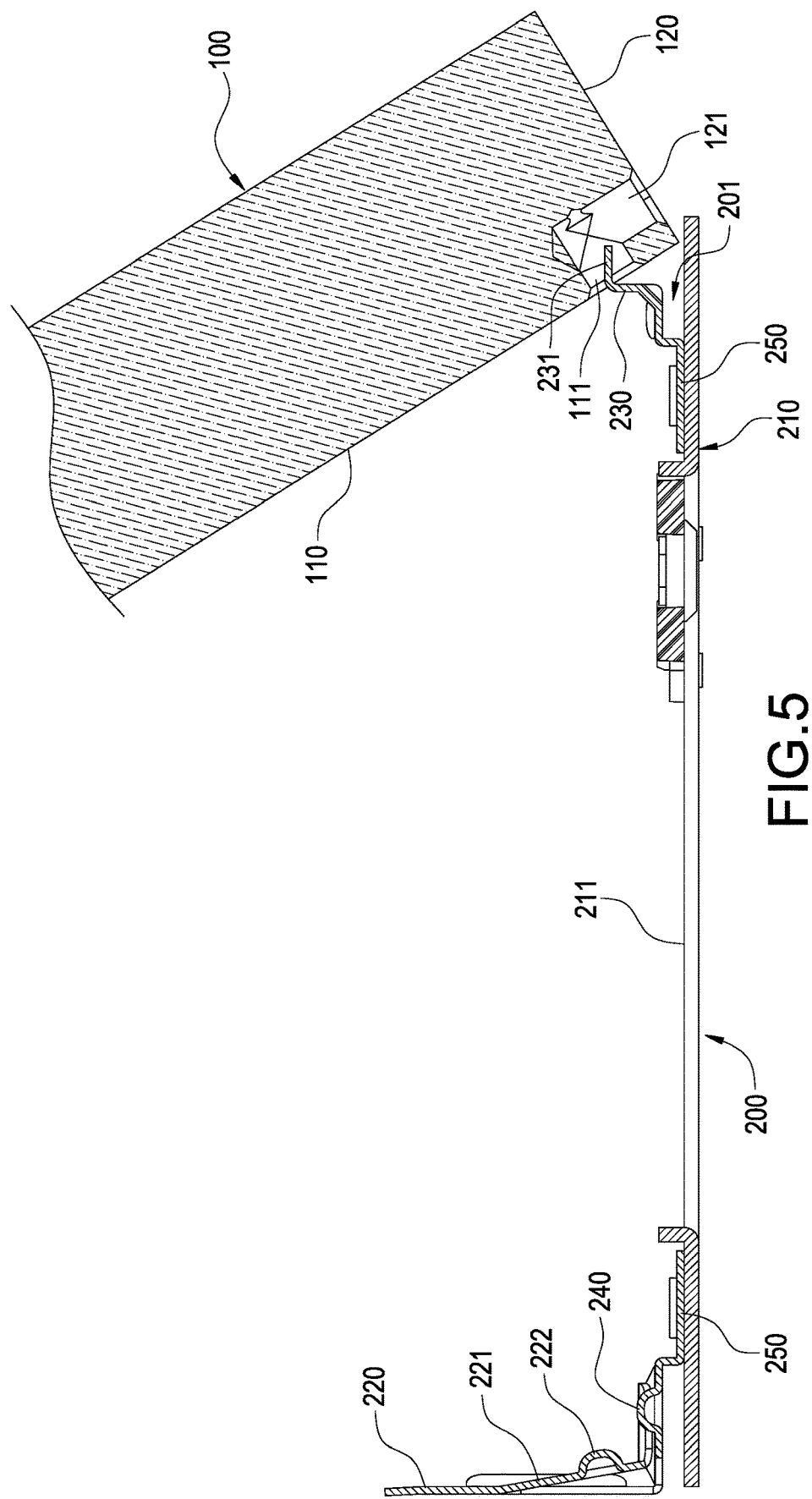
Figure 6:
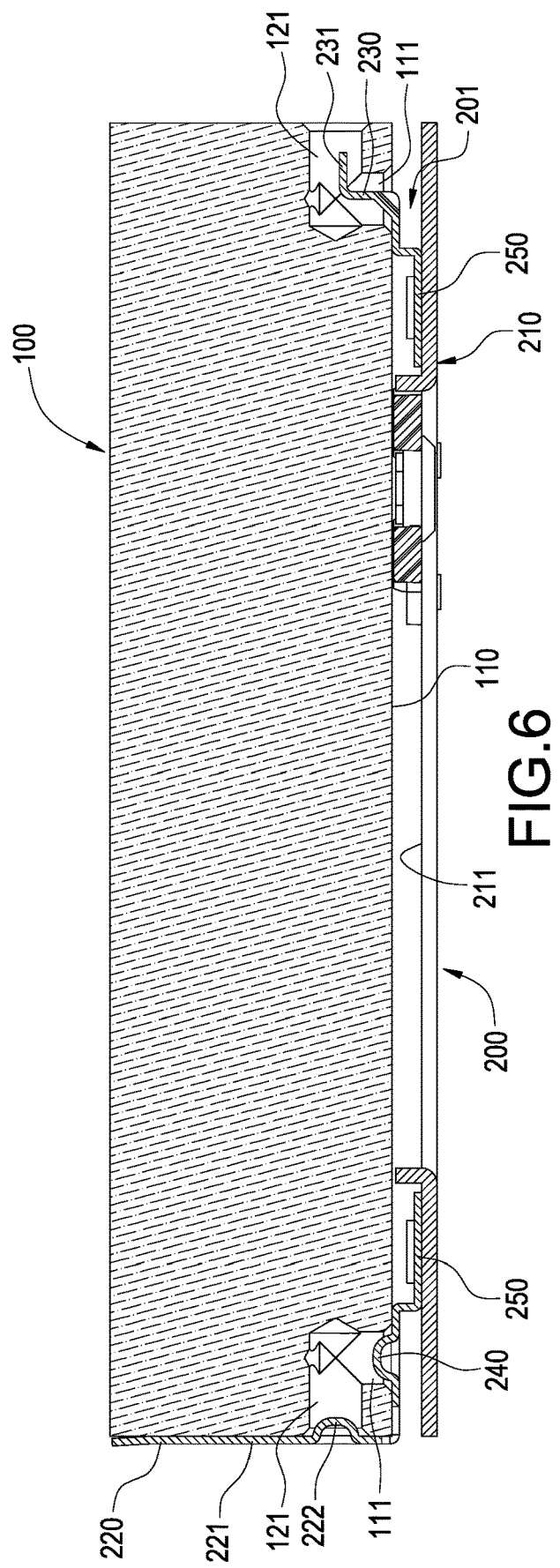

Please refer to FIG. 4 and FIG. 5. When the hard drive 100 is assembled onto the hard drive removable enclosure 200, one side the hard drive 100 is obliquely inserted into the hard drive removable enclosure 200 in order to allow the hook 231 of the top end of the primary positioning pin 230 is able to pass through the first securement hole 111 at one of the sides of the bottom surface 110 of the hard drive 100. Next, the hard drive 100 is then placed flatly into the hard drive removable enclosure 200 as shown in FIG. 1 and FIG. 6. At this time, the hook 231 at the top end of the primary positioning pin 230 is able to locked into the aforementioned first securement hole 111 fluidly connected to the second securement hole 121. In addition, the secondary positioning pin 240 is locked into the first securement hole 11 on the other side of the bottom surface 110 of the hard drive 100, and the lateral surface 120 adjacent thereto is then abutted by the elastic arm 221 in order to secure the hard drive 100. Moreover, the lock button 222 on the elastic arm 221 is able to be further locked into the second securement hole 121 on the side wall of the hard drive 100 abutted thereto. In an exemplary embodiment, the lock button 222 on the elastic arm 221 is preferably a hemisphere protruded on the elastic arm. Accordingly, during the removal of the hard drive 100, the hard drive 100 can be pushed to disengage from the lock button 222 in order to remove the hard drive 100 with ease.

Preferably, in an exemplary embodiment of the present invention, the carrier plate 210 includes a notch 212 formed to indent inward thereon, and the notch 212 is arranged at the root portion of the blocking board 220. Consequently, an operator is able to lift the hard drive 100 upward via the notch 212 in order to facilitate the removal of the hard drive 100 from the hard drive removable enclosure 200.

Figure 7:
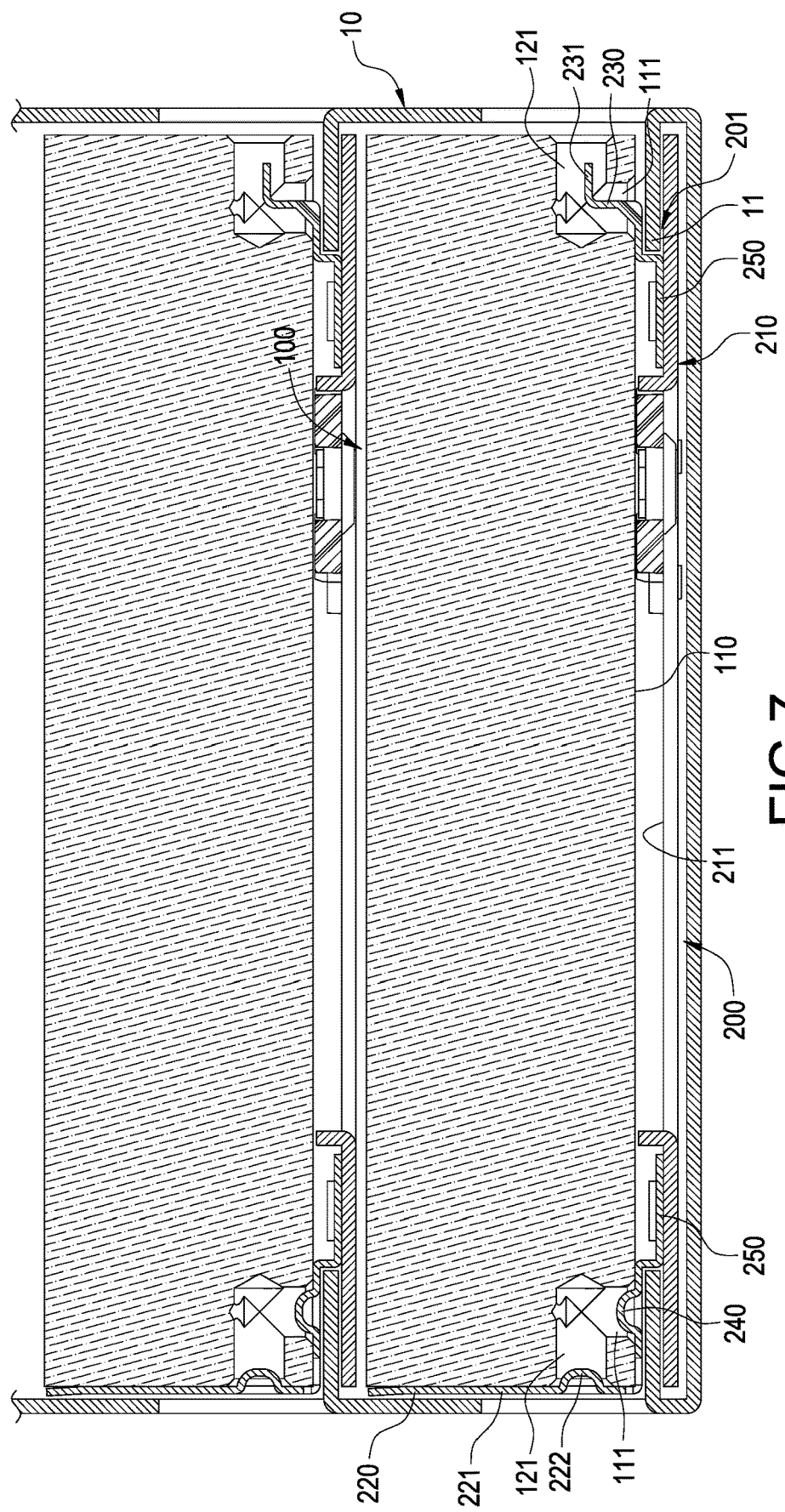
FIG. 7 is a schematic view showing a state of use of the hard drive module according to an exemplary embodiment of the present invention.

As shown in FIG. 7, when the hard drive module is placed into a server equipment (such as a cabinet, rack or slot carrier tray etc.), the sliding slots at two sides of the hard drive module are able to engage with the corresponding sliding track structures 11 (such as metal sheet edges configured horizontally) formed at the internal of the server equipment 10, in order to be moved at the corresponding position inside the server equipment 10.

The hard drive module and the hard drive removable enclosure 200 of the present invention is able to utilize the primary positioning pin 230 with its rear end formed of the hook 231 thereon and arranged inside the hard drive removable enclosure 200 in order to secure the hard drive 100 therein. Consequently, the hard drive 100 can be installed inside the hard drive removable enclosure 200 without the use of any tools. Furthermore, the carrier plate 210 requires the configuration of one blocking board 220 only, such that in comparison to a traditional box structure with six sides, the hard drive removable enclosure 200 of the present invention is of a simplified structure; therefore, the volume of the hard drive removable enclosure 200 can be decreased and the manufacturing cost thereof can also be reduced.

In view of the above, the present invention is able to achieve the objectives of the present invention and to overcome the drawbacks of known arts. The present invention is novel and of inventive step, which satisfies the patentability requirements. The above describes the preferable and feasible exemplary embodiments of the present invention for illustrative purposes only, which shall not be treated as limitations of the scope of the present invention. Any equivalent changes and modifications made in accordance with the scope of the claims of the present invention shall be considered to be within the scope of the claim of the present invention.

What is claimed is:

1. A hard drive module, comprising:
    a hard drive having a bottom surface with a first securement hole formed to intend inward thereon and a lateral surface with a second securement hole formed to intend inward thereon corresponding to the first securement hole; the second securement hole fluidly connected to the first securement hole; and
    a hard drive removable enclosure including a carrier plate having one side arranged with a vertical blocking board and a top surface arranged with a primary positioning pin protruded therefrom; and a top end of the primary positioning pin having one side arranged with a hook extended outward therefrom in a lateral direction; the bottom surface of the hard drive being received on the carrier plate, the primary positioning pin penetrating into the first securement hole from the bottom surface of the hard drive; the hook penetrating into the second securement hole from the first positioning hole; and the blocking board abutted against another lateral surface of the hard drive opposite thereto.

2. The hard drive module according to claim 1, wherein the blocking board includes an elastic arm extended therefrom, and the elastic arm is configured to bend from the blocking board toward the primary positioning pin.

3. The hard drive module according to claim 2, wherein the elastic arm includes one side having a lock button protruded therefrom, and the lock button protrudes toward the primary positioning pin in order to be further locked into another second securement hole on the another lateral surface of the hard drive.

4. The hard drive module according to claim 1, wherein the top surface of the carrier plate includes a secondary positioning pin protruded therefrom, and the secondary positioning pin is locked into another first securement hole on the bottom surface of the hard drive.

5. The hard drive module according to claim 1, wherein the carrier plate includes a positioning board stacked thereon, and a portion of the positioning board is arranged spaced apart from the carrier plate in order to form a sliding slot between the positioning board and the carrier plate.

6. The hard drive module according to claim 5, wherein the positioning board is extended to form the blocking board.

7. The hard drive module according to claim 5, wherein the positioning board is extended to form the primary positioning pin.

8. The hard drive module according to claim 1, wherein the hook is configured to extend away from the blocking board.

* * * * *